United States Patent
Hicken et al.

(10) Patent No.: US 8,245,112 B2
(45) Date of Patent: *Aug. 14, 2012

(54) FLASH MEMORY ORGANIZATION

(75) Inventors: Michael Hicken, Rochester, MN (US);
Martin Dell, Bethlehem, PA (US)

(73) Assignee: LSI Corporation, Milpitas, CA (US)

( * ) Notice: Subject to any disclaimer, the term of this patent is extended or adjusted under 35 U.S.C. 154(b) by 619 days.

This patent is subject to a terminal disclaimer.

(21) Appl. No.: 12/478,013

(22) Filed: Jun. 4, 2009

(65) Prior Publication Data

US 2010/0313100 A1    Dec. 9, 2010

(51) Int. Cl.
G11C 29/00    (2006.01)
(52) U.S. Cl. ........................................ 714/766
(58) Field of Classification Search .......... 714/763–764, 714/766, 777, 782
See application file for complete search history.

(56) References Cited

U.S. PATENT DOCUMENTS

| | | |
|---|---|---|
| 4,402,046 A | 8/1983 | Cox et al. |
| 5,121,480 A | 6/1992 | Bonke et al. |
| 5,297,029 A | 3/1994 | Nakai |
| 5,353,410 A | 10/1994 | Macon et al. |
| 5,732,409 A | 3/1998 | Ni |
| 5,734,821 A | 3/1998 | Chung et al. |
| 5,974,502 A | 10/1999 | DeKoning et al. |
| 6,049,838 A | 4/2000 | Miller et al. |
| 6,081,849 A | 6/2000 | Born et al. |
| 6,145,072 A | 11/2000 | Shams et al. |
| 6,158,004 A | 12/2000 | Mason et al. |
| 6,212,617 B1 | 4/2001 | Hardwick |
| 6,247,040 B1 | 6/2001 | Born et al. |
| 6,324,594 B1 | 11/2001 | Ellis et al. |
| 6,363,470 B1 | 3/2002 | Laurenti et al. |
| 6,385,683 B1 | 5/2002 | DeKoning et al. |
| 6,449,666 B2 | 9/2002 | Noeldner et al. |
| 6,490,635 B1 | 12/2002 | Holmes |
| 6,567,094 B1 | 5/2003 | Curry et al. |
| 6,633,942 B1 | 10/2003 | Balasubramanian |
| 6,678,785 B2 | 1/2004 | Lasser |
| 6,725,329 B1 | 4/2004 | Ng et al. |
| 6,751,680 B2 | 6/2004 | Langerman et al. |
| 7,069,559 B2 | 6/2006 | Janssen et al. |
| 7,286,549 B2 | 10/2007 | Gaur |
| 7,290,066 B2 | 10/2007 | Voorhees et al. |
| 7,408,834 B2 | 8/2008 | Conley et al. |
| 7,461,183 B2 | 12/2008 | Ellis et al. |
| 7,472,331 B2 | 12/2008 | Kim |
| 7,512,847 B2 | 3/2009 | Bychkov et al. |

(Continued)

OTHER PUBLICATIONS

Sun et al.; On the Use of Strong BCH Codes for Improving Multilevel NAND Flash Memory Storage Capacity; ECSE Department., Rensselaer Polytechnic Institute, Aug. 2006; USA.

(Continued)

*Primary Examiner* — Shelly A Chase

(57) ABSTRACT

A flash-memory system is organized into a plurality of blocks and a plurality of pages in each block, each page having $2^N$ data locations and K spare locations. At least one page in the memory has $2^M-1$ user data sectors and each sector has $2^{N-M}+L$ locations therein. Error-correction code (ECC) data related to the user data is calculated and stored in at least the $2^M$ user data locations unused by the $2^M-1$ user data sectors. Because L is at least 1 but less than $2^{N-M}$ (N>M), at least a portion of one user data sector is stored in the spare memory locations. Additional locations in each page are available to allow for the ECC data to have additional redundancy bits added per sector, thereby making the flash memory system more robust and reliable.

21 Claims, 3 Drawing Sheets

U.S. PATENT DOCUMENTS

| | | |
|---|---|---|
| 7,590,803 B2 | 9/2009 | Wintergerst |
| 7,650,449 B2 | 1/2010 | Lu |
| 7,653,778 B2 | 1/2010 | Merry et al. |
| 7,925,847 B2 | 4/2011 | Ellis et al. |
| 2003/0051078 A1 | 3/2003 | Yoshitake |
| 2003/0110325 A1 | 6/2003 | Roach et al. |
| 2003/0167395 A1 | 9/2003 | Chang et al. |
| 2004/0044873 A1 | 3/2004 | Wong et al. |
| 2004/0177212 A1 | 9/2004 | Chang et al. |
| 2005/0114729 A1 | 5/2005 | Nielsen et al. |
| 2005/0144516 A1 | 6/2005 | Gonzalez et al. |
| 2005/0203988 A1 | 9/2005 | Nollet et al. |
| 2006/0050693 A1 | 3/2006 | Bury et al. |
| 2006/0095611 A1 | 5/2006 | Winchester et al. |
| 2006/0123259 A1 | 6/2006 | Yokota et al. |
| 2007/0028040 A1 | 2/2007 | Sinclair |
| 2007/0109856 A1 | 5/2007 | Pellicone et al. |
| 2007/0255889 A1 | 11/2007 | Yogev et al. |
| 2007/0266200 A1 | 11/2007 | Gorobets et al. |
| 2008/0034153 A1 | 2/2008 | Lee et al. |
| 2008/0052446 A1 | 2/2008 | Lasser et al. |
| 2008/0082726 A1 | 4/2008 | Elhamias |
| 2008/0120456 A1 | 5/2008 | Lee et al. |
| 2008/0140916 A1 | 6/2008 | Oh et al. |
| 2008/0155145 A1 | 6/2008 | Stenfort |
| 2008/0162079 A1 | 7/2008 | Astigarraga et al. |
| 2008/0224924 A1 | 9/2008 | Lethbridge |
| 2008/0263307 A1 | 10/2008 | Adachi |
| 2008/0279205 A1 | 11/2008 | Sgouros et al. |
| 2009/0138663 A1 | 5/2009 | Lee et al. |
| 2009/0172308 A1 | 7/2009 | Prins et al. |
| 2009/0271562 A1 | 10/2009 | Sinclair |
| 2009/0271796 A1 | 10/2009 | Kojima |
| 2009/0282301 A1 | 11/2009 | Flynn et al. |
| 2009/0285228 A1 | 11/2009 | Bagepalli et al. |
| 2009/0287859 A1 | 11/2009 | Bond et al. |
| 2009/0300277 A1 | 12/2009 | Jeddeloh |
| 2009/0313444 A1 | 12/2009 | Nakamura |
| 2010/0011260 A1 | 1/2010 | Nagadomi et al. |
| 2010/0023800 A1 | 1/2010 | Harari et al. |
| 2010/0122148 A1 | 5/2010 | Flynn et al. |
| 2010/0325317 A1 | 12/2010 | Kimelman et al. |
| 2011/0041039 A1 | 2/2011 | Harari et al. |
| 2011/0055458 A1 | 3/2011 | Kuehne |
| 2011/0099355 A1 | 4/2011 | Tran |

OTHER PUBLICATIONS

Kang et al.; A Superblock-based Flash Translation Layer for NAND Flash Memory; Computer Science Division; Korea Advanced Institute of Science and Technology (KAIST); EMSOFT '06 Seoul, Korea; pp. 161-170; Published by ACM, New York, NY, USA, 2006.

Micron Technology, Inc.; NAND Flash 101: An Introduction to NAND Flash and How to Design It in to Your Next Product; TN-29-19; 2006; pp. 1-28; Micron Technology, Inc., Boise, Idaho, USA.

Andrew Birrell & Michael Isard, et al., A Design for High-Performance Flash Disks, ACM SIGOPS Operating Systems Review, vol. 41, Issue 2, pp. 88-93, (Apr. 2007).

TCG Core Architecture Specification, Version 2.0, Trusted Computing Group, 2009 USA.

TCG Storage Interface Interactions Specification, Version 1.0, Trusted Computing Group, 2009 USA.

TCG Storage SSC: Enterprise, Version 1.0, Trusted Computing Group 2009 USA.

TCG Storage SSC: Opal, Version 1.0, Trusted Computing Group 2009 USA.

Specification for the Advanced Encryption Standard (AES), Federal Information Processing Standard (FIPS) Publication 197, 2001 USA.

Specification for the Secure Hash Standard (SHS), FIPS Publication 180-3 (2008), National Institute of Standards and Technology (NIST) USA.

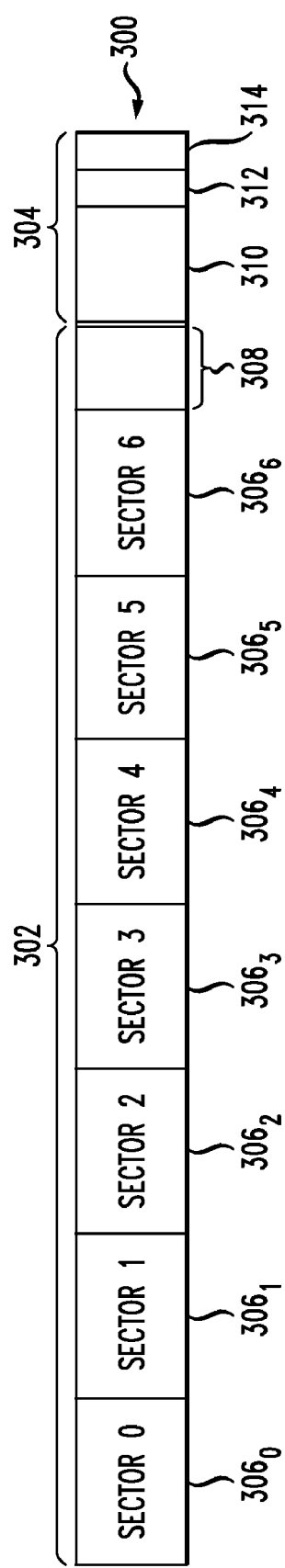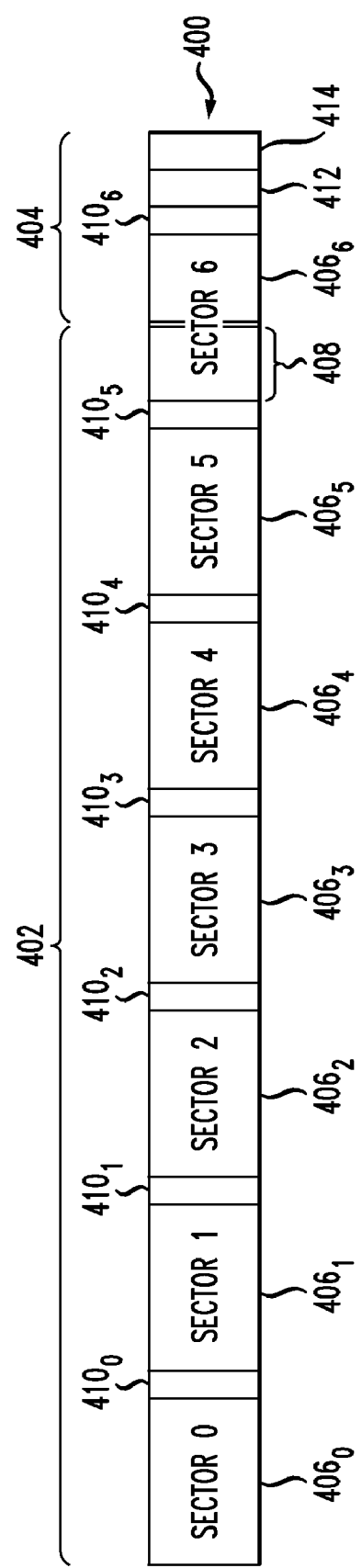

FLASH MEMORY ORGANIZATION

CROSS-REFERENCE TO RELATED APPLICATIONS

The subject matter of this application is related to copending U.S. patent application Ser. No. 12/477,996, filed concurrently with this application, having common inventors with this application, assigned to the same assignee as this application, and the teachings of which are incorporated herein in its entirety by reference. The subject matter of this application is also related to U.S. patent application Ser. Nos. 12/436,227 filed May 6, 2009, 12/475,710 filed Jun. 1, 2009, 12/475,716 filed Jun. 1, 2009, 12/478,013 filed Jun. 4, 2009, 12/508,879 filed Jul. 24, 2009, 12/508,915 filed Jul. 24, 2009, 12/643,471 filed Dec. 21, 2009, 12/649,490 filed Dec. 30, 2009, 12/722,828 filed Mar. 12, 2010, 12/730,627 filed Mar. 24, 2010, 12/731,631 filed Mar. 25, 2010, 12/767,985 filed Apr. 27, 2010, 12/768,058 filed Apr. 27, 2010, 12/769,882 filed Apr. 29, 2010 and 12/769,910 filed Apr. 29, 2010.

TECHNICAL FIELD

The present invention relates to flash-memory generally, and, in particular, to flash-memory file system architectures or the like.

BACKGROUND

Disk-drive (or hard-drive) memory systems are being replaced with solid-state memory systems utilizing flash-memory technology. Compared to hard-drive systems, flash-memory systems offer the reliability of semiconductor-based memory along with less energy consumption and smaller size. While significant in-roads have been made in replacing hard-drives in consumer-based products such as in laptop computers, few of the hard-drives in enterprise-level systems have been replaced with solid-state drives for a variety of reasons. The most notable reason is the incompatibility of the file system structure in existing flash drive systems with the file system structure in enterprise-based hard-drives. This incompatibility is forced by the flash-memory architecture and by de facto hard-disk file structure system conventions.

Generally, flash-memory architecture requires the erasure of large blocks of memory but subsections, referred to as pages, may be written to as needed. Within each page, there are usually $2^N$ bytes of memory (N is an integer and, at present, N ranges from 10 to 14 or more) for storing user data and an additional 100 to 500 or more bytes of memory for storing redundancy data (ECC) and file system information (e.g., metadata). The ECC is for detecting and correcting data stored in the corresponding user data in the page and the file system information is used for mapping virtual to physical addresses and vice-versa. As such, the additional bytes of memory are "hidden" from the user and are not available for storing data.

For consumer applications, hard-drive systems have data sectors that are generally arranged with data sized in powers of two, e.g., $2^8$ or $2^{10}$ bytes per sector. This works well with flash memories having similarly structured user data memory pages. However, for enterprise-based systems, the sectors are not sized by powers of two but larger, e.g., 520 or 528 bytes instead of 512 bytes ($2^9$). At present, forcing these larger sectors into existing flash-memory architectures results in inefficient designs with many unused bytes in each page, at least partially negating the advantages of flash-memory systems over hard-drive systems. Moreover, with these larger sectors, the number of bytes available for ECC and metadata will be reduced. This will likely result in lower levels of ECC protection for the data than is desired, particularly for very small geometry (65 nm or smaller) flash memories.

SUMMARY

In one embodiment, the present invention is a flash memory system having a plurality of pages, each page having $2^N$ data locations and K spare locations. At least one page comprises $2^M-1$ or less user data sectors, each sector having $2^{N-M}+L$ locations therein, and an error-correction code (ECC) data related to the user data and stored in at least the $2^M$ user data locations unused by the $2^M-1$ user data sectors. At least a portion of one user data sector is stored in the spare locations and M, N, L, and K are positive integers, where N>M, M≧1, $1 \leq L < 2^{N-M}$.

In another embodiment, the present invention is a method comprising: providing a flash memory system having a plurality of pages, each page having $2^N$ data locations and K spare locations, at least one page storing no more than $2^M-1$ user data sectors therein; storing user data in at least one of the $2^M-1$ user data sectors, each of the user data sectors having $2^{N-M}+L$ locations therein; calculating error-correction code (ECC) data related to the stored user data; and storing the ECC data in at least the $2^M$ data locations unused by the $2^M-1$ user data sectors. At least a portion of one user data sector is stored in the spare locations and M, N, L, and K are positive integers, where N>M, M≧1, $1 \leq L < 2^{N-M}$.

BRIEF DESCRIPTION OF THE DRAWINGS

The aspects, features, and advantages of the present invention will become more fully apparent from the following detailed description, the appended claims, and the accompanying drawings in which like reference numerals identify similar or identical elements.

FIG. 3 is a simplified diagram of a file system structure for the flash-memory system of FIGS. 1 and 2, according to one embodiment of the invention; and FIG. 4 is a simplified diagram of an alternative file system structure for the flash-memory system of FIGS. 1 and 2, according to another embodiment of the invention.

DETAILED DESCRIPTION

Acronyms and Definitions

Application Programming Interface (API): protocol or format used by an application to communicate with a different application.

Block: the number of memory locations that are erased at one time in a flash-memory.

ECC data: error correction code information. This is redundancy information relating to data written to the memory used to detect and, if possible, correct data read from the memory.

Inter-Processor Communications (IPC): communications protocol for communications between processors or systems.

Page: the minimum number of memory locations that are read or written at a time within a block.

Sector: the number of bytes that are grouped together within a page. There are multiple sectors in each page.

EXEMPLARY EMBODIMENTS OF THE INVENTION

For purposes of this description and unless explicitly stated otherwise, each numerical value and range should be interpreted as being approximate as if the word "about" or "approximately" preceded the value of the value or range. Further, signals and corresponding nodes, ports, inputs, or outputs may be referred to by the same name and are interchangeable.

Additionally, reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the terms "implementation" and "example."

Also for purposes of this description, the terms "couple," "coupling," "coupled," "connect," "connecting," or "connected," refer to any manner known in the art or later developed in which a signal is allowed to be transferred between two or more elements and the interposition of one or more additional elements is contemplated, although not required. Conversely, the terms "directly coupled," "directly connected," etc., imply the absence of such additional elements.

Figure 1:
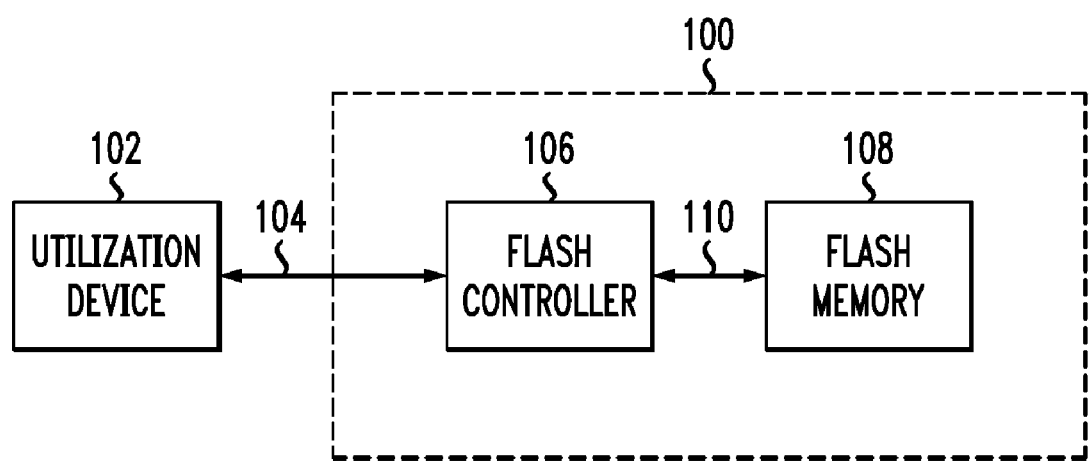
FIG. 1 is a simplified diagram of an exemplary flash-memory system.

In FIG. 1, a simplified exemplary flash-memory storage system 100 is diagrammed. Here, the memory system 100 communicates with a utilization device 102, such as a computer system, via communication link 104. The communication link 104 may be one of a variety of standard communication interface standards and protocols, such as SAS/SCSI (serial attached storage/small computer system interface), SATA (serial advanced technology attachment), USB (universal serial bus), IEEE 802.11, IEEE 802.1, etc., or a custom interface, as desired. Inside of the storage system 100 is a flash controller 106 and flash-memory array 108 in communication with the controller 106 by a conventional communications path 110. As will be explained in more detail below, the flash controller 106 controls the writing and reading of data from the utilization device 102 and the memory 108. For purposes here, the flash controller 106 has one or more processors (not shown) therein along with the software/firmware as needed for operation.

As is well known in the art, the flash-memory may be composed of a single chip or multiple chips. Operation of the flash-memory 108 (e.g., erase, write, and read operations) is well known; see, for example, "NAND Flash 101: An Introduction to NAND Flash and How to Design it into Your Next Product" by Micron Technology, Inc., TN-29-19, July, 2004, incorporated herein by reference in its entirety. Each memory chip is physically organized into blocks and typical memories have blocks of one megabyte or more. The blocks are in turn subdivided into pages, and each page further subdivided into sectors. Thus, and as will be discussed in more detail below, a file system utilizing a flash-memory writes data into a block on a page-by-page basis, each page having multiple sectors therein. Similarly, when reading data from the memory, a page at a time is read and all the sectors within the page are read. Data is organized into sectors to retain compatibility with hard-disk file systems.

Existing flash memories typically have a power of two pages per block (e.g., $2^8$, $2^{10}$, etc.); each page has power of two memory locations (e.g., $2^{12}$ memory locations, each location storing a byte) allocated for data storage and a spare set of memory locations available for reading and writing along with the other bytes in the page (e.g., 128, 218, 224 bytes for a $2^{12}$ byte page, and 376 or 520 bytes for a $2^{13}$ byte page). The spare set of memory locations has heretofore been reserved for storing ECC data segments and other metadata (used by the FTL process, described below) for the data stored in the memory locations of the page. In a typical consumer flash-memory system, such as in an MP3 player, each page has multiple sectors, each sector having $2^9$ memory locations (512 bytes). This results in the page storing eight sectors ($2^{12}/2^9=8$), along with the spare memory locations containing the necessary ECC data and metadata related to the sectors in the page. However, hard-disk enterprise (non-consumer) systems have 520 or 528 bytes in each sector and attempting to store eight of these larger sectors in a page will exceed the number of memory locations allocated for data storage.

Figure 2:
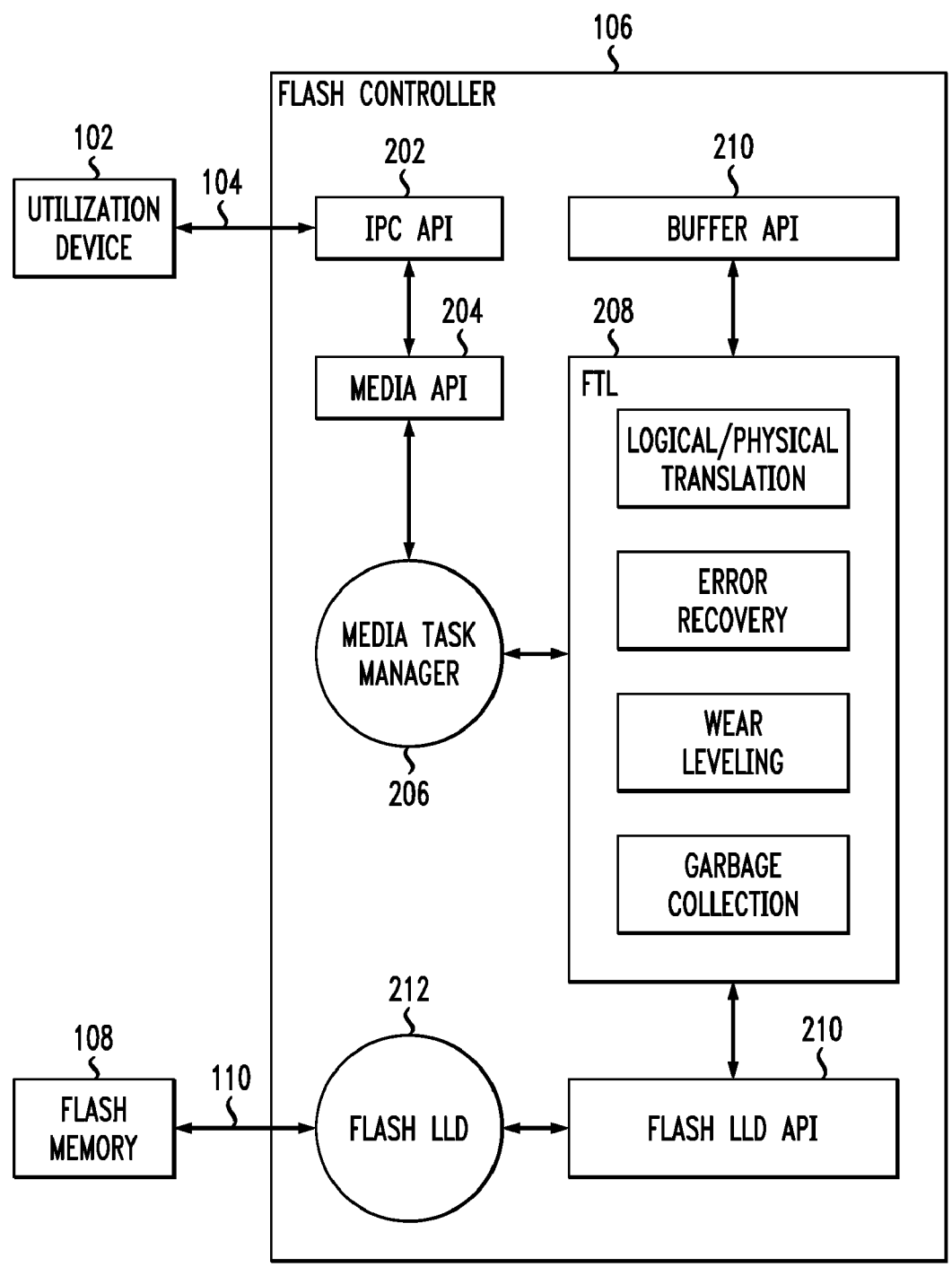
FIG. 2 is a logical diagram of exemplary functional portions of the flash-memory system of FIG. 1.

FIG. 2 illustrates the functionality of the flash controller 106 using a logical or functional diagram of various software/firmware processes implemented within the controller 106; it is understood that other organizations of the functional elements in the controller 106 are possible, as well as adding processes or moving the processes to other processors, such as into the utilization device 102. In this example and as is well known in the art, conventional IPC API 202 and media API 204 implements the protocol required to operate the communications link 104 (e.g., utilizing parallel data and address buses) and to control the flow of data between the utilization device 102 and the controller 106, as described above. The media task manager process 206 processes data access commands from the utilization device and communicates with the FTL (flash translation layer) process 208 to provide the desired functionality of flash-memory system 100 (FIG. 1). The FTL process 208, as will be explained in more detail below, makes the flash-memory system 100 (FIG. 1) appear to the utilization device as a block-oriented device, similar to a hard disk drive. The FTL 208 uses a conventional buffer via buffer API 210 to temporarily store and retrieve data as needed. The FTL process 208 interfaces with the flash-memory 108 via a flash-memory low-level driver (LLD) API 210 and a conventional flash-memory LLD 212. The LLD 212 separates the low-level hardware-specific signal and timing requirements of the flash-memory circuitry from the functionality of the FTL process by implementing the hardware-specific basic read and write operations of the memory 108.

As is well understood in the art, the FTL 208 translates the logical-to-physical addresses (and vice-versa) of data stored in the memory 108 by using, for example, the metadata stored in the flash-memory page being accessed. Further, the FTL 208 provides "garbage collection" (the identification of unused flash-memory pages for reuse), error recovery (adding redundancy information to data stored in the memory 108 and correcting erroneous data read from the memory), and wear leveling (spreading the erasing and writing of blocks of memory cells over the entire flash-memory to avoid repeatedly erasing and writing a subset of the memory blocks, thereby making the flash-memory last longer than would otherwise occur). Details on how an FTL operates and is organized are described in "A Superblock-based Flash Translation Layer for NAND Flash-memory" by Kang et al., presented at EMSOFT '06, 22-25 Oct. 2006 in Seoul, Korea, included herein by reference in its entirety.

To improve the reliability of the flash memory system 100 (FIG. 1) and the integrity of the data stored therein, the ability to detect and correct data stored in the flash memories can be enhanced by increasing the number of bits in the ECC data in relation to the number of bits in the user data being "protected" by the ECC data. A typical ECC code is a (n, k, t) BCH (Bose-Chaudhuri-Hocquenghem) code, a subclass of Hamming codes and well known in the industry, where n is the total number of bits available for the code, k is the number of bits being protected by the code, and t is the maximum number of bits that can be corrected over the k bits. The difference between n and k is the number of redundancy or ECC bits used by the code to protect the k bits of data. For example, in a conventional flash memory, there is typically a total of 4320 bytes available in a page (i.e., 4096 bytes of "data" locations and 224 bytes of "spare" locations) and using eight 512-byte data sectors, then each sector has allocated to it 512 bytes of data locations and 28 bytes of spare locations, making a total of 540 bytes available per sector. Assuming that four of those bytes in each sector are for metadata (the amount needed depends upon the FTL firmware process 208 being used in FIG. 2), up to 536 bytes is available for data and ECC (4288 bits, 8 bits/byte), which is the maximum that n can be. Thus, a (4288, 4096, 14) BCH code is typically used, providing up to 14 bits of correction to the information in the 540-byte sector. However, if the sector size is increased to 520 or 528 bytes, the number of redundancy bits is concomitantly reduced to a number (e.g., 64 bits for a 528-byte sector) that results in a BCH code so weakened that it can only correct up to four bits (t=4), an unacceptably low level of protection. To correct this shortcoming, if the BCH code is made stronger to get the traditional level of protection (e.g., the ability to correct 14 or more bits, i.e., $t \geq 14$), then the total number of bits required by for ECC data will exceed the amount of storage in the page. To provide a minimum of 14 bits of correction when using 520 or 528 byte sectors, at least 184 bits (23 bytes) of redundancy data per sector are desired. Moreover, as the dimensions of the flash memory cells decrease (e.g., below 65 nm minimum dimension lithography), it is expected that the level of protection (the number of bits that can be corrected in a sector) will need to be increased for a stronger BCH code that is capable of correcting 30 or more bits. To do so, having at least 392 redundancy bits (49 bytes) are desired. Calculating the desired BCH code is well understood in the art.

In accordance with one embodiment of the invention, FIG. 3 illustrates a new organization of the pages in a memory file system permitting the efficient storing of enterprise-sized sectors in a page. Here, an exemplary page 300 in a flash-memory block (not shown) has therein two portions, the conventional data storage portion 302 having $2^N$ (N=12 in this example) memory locations, and the "spare" area 304 having several-hundred memory locations. In this example, $2^M$ (here M=3) conventional enterprise-sized sectors 306₀-306₆ (here $2^{N-M}$+L bytes per sector, where $1 \leq L < 2^{N-M}$; for a 520 or 528 bytes sector in this example, L=8 ($2^3$) or 16 ($2^4$), respectively) are shown not filling the portion 302. Instead, large ECC data segments 310 (shown here as one ECC data segment), related to the corresponding sectors 306₀-306₆, are stored in the unused portions 308 of data storage portion 302 and the spare area 304, along with metadata 312 (if any). The metadata 312 may have its own ECC (not shown) to protect the metadata from corruption, or the ECC data 310 may also cover the metadata 312, as desired. The remainder 314 of the spare area 304 may be unused or allocated for additional metadata or ECC data as required. Alternatively, for example where N=13, L can be larger (e.g., $2^3$, $2^4$ or $2^5$) with a correspondingly larger sector size or more sectors to the page. For 520 byte sectors, an enhanced ECC code, such as a (4928, 4160, 59) BCH code, may be used. This code requires 768 ECC bits (96 bytes) per 520-byte sector to correct up to 59 bits in each of the sectors, resulting in 4312 bytes per page 300 (seven sectors per page) and 762 bytes of ECC data per page. Thus, the (4928, 4160, 59) BCH code requires 456 bytes ECC data in portion 308 and 216 bytes of additional ECC data 316 in the spare area 304. For 528 byte sectors, an enhanced BCH code, such as a (4928, 4224, 54) BCH code, may be used. Using this code requires 704 ECC bits (88 bytes) per 528 byte sector to correct up to 54 bits in each of the sectors, also requiring only 216 bytes of additional ECC data 316 in the spare area 304. It is understood that two or more sectors (e.g., 1056 bytes) may be protected with one set of ECC bits or that sectors may be much larger than described above.

In accordance with another embodiment of the invention, FIG. 4 illustrates another new organization of the pages in a memory file system permitting the efficient storing of enterprise-sized sectors in a page along with enhanced ECC protection of the stored sectors. Because the page organization in FIG. 4 is similar to the page organization of FIG. 3, the elements in FIG. 4 that are similar to corresponding elements in FIG. 3 will be referred to using the nomenclature 4XX, where XX refers to the corresponding element in FIG. 3. Here, the seven conventional enterprise-sized sectors 406₀-406₆ are shown not filling the portion 402, leaving unused portions 408 of the portion 402. Instead, distinct from the page organization of FIG. 3, the ECC data segments 410₀-410₆ are related to and stored adjacent to the corresponding sectors 406₀-406₆. The metadata 412 may remain in the spare area 404 (along with ECC data (not shown) used to protect the metadata 412) and the remainder 414 of the spare area 404 may be unused or allocated for additional metadata or ECC data as required. Alternatively, the metadata 412 may be divided up and placed into the ECC data segments 410₀-410₆, and the metadata protected by the corresponding ECC data segment. Similar to that discussed above, for 520 byte sectors, an enhanced ECC code, such as a (4928, 3640, 59) BCH code, may be used. For 528 byte sectors, an enhanced BCH code, such as a (4928, 3696, 54) BCH code, may be used. In either case only 216 bytes of the spare area 304 is used with these two exemplary BCH codes.

It is understood that other BCH code configurations or different Hamming-class codes may be used instead of those discussed above, as needed.

Advantageously, by using unused portions (308, 408) of the user data portion (302, 304) to store additional ECC data and, if needed, storing user data in the spare area (304, 404) that was previously off-limits to user data, enterprise-sized sectors can be efficiently and reliably stored in flash memories with little wasted memory, thereby making flash-memory systems compatible with existing hard-drive storage systems in enterprise system applications.

It is understood that the FTL process 208 (FIG. 2) is configured (programmed) to implement the new page structures of FIGS. 3 and 4; changes to the FTL process 208 are conventional given the teachings of the file system structure described above.

It is further understood that various changes in the details, materials, and arrangements of the parts and processes which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. A flash memory system having a plurality of pages, each page having $2^N$ data locations and K spare locations, and at least one page comprising:
    $2^M-1$ or less user data sectors, each sector having $2^{N-M}+L$ locations therein; and
    error-correction code (ECC) data related to the user data and stored in at least the $2^M$ user data locations unused by the $2^M-1$ user data sectors;
    wherein M, N, L, and K are positive integers, N>M, M≧1, $1 \leq L < 2^{N-M}$, and wherein at least a portion of one user data sector is stored in the spare locations.

2. The memory system of claim 1, wherein the ECC data comprises $2^M-1$ ECC data segments, each segment corresponding to one of the user data sectors.

3. The memory system of claim 2, wherein at least a portion of an ECC data segment is stored in the spare locations.

4. The memory system of claim 2, wherein the ECC data segments are stored adjacent to the corresponding user data sectors.

5. The memory system of claim 1, wherein the ECC data is calculated using a 1-lamming-class code.

6. The memory system of claim 5, wherein the 1-lamming-class code is a BCH code having at least 392 bits of redundancy per user data sector.

7. The memory system of claim 1, wherein the memory is arranged in bytes, and $L=2^P$, where P is a positive integer.

8. The memory system of claim 7, wherein M=3, N=12, P=3 or 4, and K=224.

9. The memory system of claim 7, wherein M=4, N=13, P=3, 4, or 5, and K=520.

10. A method comprising:
    providing a flash memory system having a plurality of pages, each page having $2^N$ data locations and K spare locations, at least one page storing no more than $2^M-1$ user data sectors therein;
    storing user data in at least one of the $2^M-1$ user data sectors, each of the user data sectors having $2^{N-M}+L$ locations therein;
    calculating error-correction code (ECC) data related to the stored user data; and
    storing the ECC data in at least the $2^M$ user data locations unused by the $2^M-1$ user data sectors;
    wherein M, N, L, and K are positive integers, N>M, M≧1, $1 \leq L < 2^{N-M}$, and wherein at least a portion of one user data sector is stored in the spare locations.

11. The method of claim 10, further comprising the step of reading at least one of the $2^M-1$ user data sectors and corresponding ECC data.

12. The method of claim 11, further comprising the step of checking and, if required, correcting the read user data.

13. The method of claim 10, wherein at least a portion of an ECC data segment is stored in the spare locations.

14. The method of claim 10, wherein the ECC data are configured into $2^M-1$ segments, each segment corresponding to one of the user data sectors.

15. The method of claim 10, wherein the ECC data are calculated using a Hamming-class code.

16. The method of claim 15, wherein the Hamming-class code is a BCH code having at least 392 bits of redundancy per user data sector.

17. The method of claim 10, wherein the memory is arranged in bytes, and $L=2^P$, where P is a positive integer.

18. The method of claim 17, wherein M=3, N=12, P=3 or 4, and K=224.

19. The method of claim 17, wherein M=4, N=13, P=3, 4, or 5, and K=520.

20. A method comprising:
    providing a flash memory system having a plurality of pages, each page having $2^N$ data locations and K spare locations, at least one page storing no more than $2^M-1$ user data sectors therein;
    storing user data in at least one of the $2^M-1$ user data sectors, each of the user data sectors having $2_{N-M}+L$ locations therein;
    calculating error-correction code (ECC) data related to the stored user data;
    reading at least one of the $2^M-1$ user data sectors and corresponding ECC data; and
    checking and, if required, correcting the read user data;
    storing the ECC data in at least the $2^M$ user data locations unused by the $2^M-1$ user data sectors;
    wherein M, N, L, and K are positive integers, N>M, M≧1, $1 \leq L < 2^{N-M}$, and wherein at least a portion of one user data sector is stored in the spare locations, and wherein the ECC data calculated using a BCH code having at least 392 bits of redundancy per user data sector.

21. The method of claim 20, wherein the memory is arranged in bytes, M=3, N=12, $L=2^P$, P=3 or 4, and K=224.

* * * * *